United States Patent
Zhao et al.

(10) Patent No.: US 10,262,280 B2
(45) Date of Patent: Apr. 16, 2019

(54) ENSEMBLE BASED DECISION MAKING

(71) Applicant: CONOCOPHILLIPS COMPANY, Houston, TX (US)

(72) Inventors: Yong Zhao, Houston, TX (US); Andre J. Bouchard, Houston, TX (US); Brian S. Ludolph, Houston, TX (US)

(73) Assignee: CONOCOPHILLIPS COMPANY, Houston, TX (US)

( * ) Notice: Subject to any disclaimer, the term of this patent is extended or adjusted under 35 U.S.C. 154(b) by 325 days.

(21) Appl. No.: 15/208,296

(22) Filed: Jul. 12, 2016

(65) Prior Publication Data

US 2017/0017883 A1 Jan. 19, 2017

Related U.S. Application Data

(60) Provisional application No. 62/191,644, filed on Jul. 13, 2015.

(51) Int. Cl.
| | |
|---|---|
| *G06Q 10/06* | (2012.01) |
| *G06F 17/50* | (2006.01) |
| *E21B 43/00* | (2006.01) |
| *E21B 41/00* | (2006.01) |
| *G06N 99/00* | (2019.01) |

(52) U.S. Cl.
CPC ............ *G06Q 10/06* (2013.01); *E21B 41/00* (2013.01); *E21B 43/00* (2013.01); *G06F 17/5009* (2013.01); *G06N 99/005* (2013.01); *Y04S 10/54* (2013.01)

(58) Field of Classification Search
CPC .. G06Q 10/06; G06F 17/5009; G06N 99/005; E21B 41/00; E21B 43/00
See application file for complete search history.

(56) References Cited

U.S. PATENT DOCUMENTS

| | | | |
|---|---|---|---|
| 7,512,543 B2 | 3/2009 | Raghuraman et al. | |
| 7,584,081 B2 * | 9/2009 | Wen | E21B 43/00 703/10 |
| 8,285,532 B2 * | 10/2012 | Zangl | E21B 49/00 703/10 |
| 8,335,677 B2 * | 12/2012 | Yeten | E21B 43/00 703/10 |
| 8,504,335 B2 | 8/2013 | Furman et al. | |
| 8,775,361 B2 * | 7/2014 | Goel | G06Q 10/06 703/10 |
| 2007/0118346 A1 | 5/2007 | Wen et al. | |
| 2010/0185428 A1 | 7/2010 | Vink | |
| 2010/0332442 A1 | 12/2010 | Goel et al. | |

(Continued)

OTHER PUBLICATIONS

Naevdal, G., et al., "Near-well reservoir monitoring through ensemble Kalman filter: Reservoir monitoring and continuous model updating using ensemble Kalman filter", SPE 75235 (2002).

(Continued)

*Primary Examiner* — Vanthu T Nguyen
(74) *Attorney, Agent, or Firm* — CONOCOPHILLIPS COMPANY

(57) ABSTRACT

A method for accelerating the decision making process for reservoir risk management is described. In particular, an ensemble based decisions and filter are used to quickly compare different information scenarios to determine the best strategy for developing a hydrocarbon-containing reservoir.

20 Claims, 8 Drawing Sheets

(56) References Cited

U.S. PATENT DOCUMENTS

2011/0307230 A1* 12/2011 Lee .................. E21B 41/00
                                                    703/10
2012/0191433 A1   7/2012 Heidari et al.
2012/0215511 A1   8/2012 Sarma et al.
2013/0246032 A1*  9/2013 El-Bakry ............. E21B 41/00
                                                    703/10
2013/0338983 A1  12/2013 Sarma et al.

OTHER PUBLICATIONS

Naevdal, G., et al., "Reservoir monitoring and continuous model updating using ensemble Kalman filter," available online at http://enkf.nersc.no/Publications/nae03a.pdf, SPE 84372 (2003).

Aanonsen S.I., et al., The Ensemble Kalman Filter in Reservoir Engineering—A Review, SPE-117274-PA (2009).

Lorentzen, R. J., et al., SPE 96375 (2005), Analysis of the ensemble Kalman filter for estimation of permeability and porosity in reservoir models, available online at http://enkf.nersc.no/Publications/lor05a.pdf.

Wen X.H. et al., Real-Time Reservoir Model Updating Using Ensemble Kalman Filter, available online at http://enkf.nersc.no/Publications/wen05a.pdf, SPE 92991 (2003).

International Search Report for related case, App. No. PCT/US2016/41921, dated Sep. 23, 2016.

* cited by examiner

ENSEMBLE BASED DECISION MAKING

PRIOR RELATED APPLICATIONS

This application is a non-provisional application which claims benefit under 35 USC § 119(e) to U.S. Provisional Application Ser. No. 62/191,644 filed Jul. 13, 2015, entitled "ENSEMBLE BASED DECISION MAKING," which is incorporated herein in its entirety.

FIELD OF THE DISCLOSURE

The disclosure relates to reservoir management, particularly to fast estimation of the value of information (VOI) needed in the decision making process.

BACKGROUND OF THE DISCLOSURE

Developing and managing petroleum resources often entails committing large economic investments over many years with an expectation of receiving correspondingly large financial returns. Whether a petroleum reservoir yields profit or loss depends largely upon the strategies and tactics implemented for reservoir development and management. Due to the inaccuracy of logging tools and unpredictable natural variations in geometry and geological parameters, there is considerable uncertainty as to the detailed characterization of a hydrocarbon reservoir. This uncertainty, coupled with the dramatic variations in the market value of hydrocarbon production, has heightened the importance of financial factors and risk management in reservoir strategies so as to maximize reservoir value. As such, reservoir development planning involves devising and/or selecting strong strategies and tactics that will yield favorable economic results over the long term.

Reservoir risk management involves optimizing assets given inherent reservoir uncertainties and minimizing risk by reducing these uncertainties. Optimizing assets usually involves making decisions about technologies and strategies (such as advanced completion systems, drilling a new well, setting injection or production target rates, etc.) and quantifying the value of implementing the proposed technology in the presence of physical and financial uncertainties. Physical uncertainty includes uncertainty in the type of reservoir model used and the properties used to populate the model. Financial uncertainties refer to uncertainty in the financial variables associated with the asset, such as the discount rate, hydrocarbon price, etc.

The optimization process thus should be stochastic, with a risk level (or alternatively a confidence level) associated with the optimized solution. Based on the cost-benefit analysis (cost of implementing the technology versus the gain or value from the implementation) and the associated risk level, a decision may be made on implementing the technology.

Minimizing the risk level involves gathering information about the reservoir to reduce or eliminate the inherent uncertainties. The cost of gathering this information should be balanced against the value the information brings to the stochastic optimization process. Valuation of information can then guide decisions on implementing monitoring technologies for uncertainty reduction.

Typical subsurface reservoir value of information concepts (e.g., decision trees) are limited in the number of variables that can be handled (say 1-3) and are not suitable for spatial variables such as reservoir properties at a particular location.

Thus, there exists a need in the art for a method of handling more variables when evaluating information for reservoir risk management. Ideally, such a method would also allow for incorporation of many data types and uncertainties to fully describe the system being evaluated.

SUMMARY OF THE DISCLOSURE

This disclosure presents a value of information (VOI) modeling method that uses an ensemble based model and model filter to accelerate a decision making process. In particular, the modeling combines multiple data types into a single ensemble model that has a large number of uncertainty parameters. A system performance variable and uncertainty band can then be calculated from the ensemble model's predictions. If additional information needs to be collected to reduce the uncertainty band, then an ensemble-based filter can be used to decrease computational time by picking the most valuable and economical information needed to improve the decision-making.

The methods presented herein are applicable to various disciplines; however, they will be exemplified using a hydrocarbon reservoir appraisal workflow.

In more detail, an ensemble model is built using a number of realizations, i.e., 100 realizations, from existing data of the same data type or from a mixture of multi-disciplinary data. This ensemble model (E0) defines an input uncertainty band and has a utility function. The decision-making is based on maximizing this utility function and reducing the uncertainty band.

An ensemble prediction of some system performance output variable is calculated from the ensemble model (E0) and a decision (D0) from one or more target percentiles, i.e. P10/P50/P90 is defined. If the uncertainty bands are large, then additional information may need to be collected to decrease the risk in making a decision based on the ensemble model.

In one aspect of the present method, the ensemble model is updated using possible or expected data for a given scenario. This temporary ensemble model should have a small uncertainty band. If more than one scenario is possible, then a temporary model will be created for each scenario.

The ensemble prediction for each temporary model is used to find a decision Dn. The value of the scenario and its information on the decision making process is calculated by taking the difference in the utility function between D0 and Dn. This is repeated for each scenario. If the value of the scenario falls within a target percentile, then it will be selected and more data will be gathered for incorporation into the original ensemble model.

Once the uncertainty band is within an acceptable range, a decision will be made using the ensemble model after it has been updated with important information.

In some embodiments, the method utilizes the ensemble Kalman Filter (EnKF) to accelerate the evaluation process and creation of temporary ensemble models. The EnKF is a sophisticated sequential data assimilation method. It applies an ensemble of model states to represent the error statistics of the model estimate, applies ensemble integrations to predict the error statistics forward in time, and uses an analysis scheme that operates directly on the ensemble of model states when observations are assimilated. The EnKF has proven to efficiently handle strongly nonlinear dynamics and large state spaces.

The data analyzed hereunder can be any mixture of multi-disciplinary data including, but not limited to, core, well, and production logging data, production data, tracers, seismic data, permeability and porosity data, and any permutations of existing in subsurface reservoir surveillance and illumination data acquisition technologies as well as any new subsurface reservoir surveillance and illumination data acquisition technologies.

From an oil and gas application perspective, the range of application of this method spans the subsurface reservoir asset life-cycle, including:

Where to drill an exploration well and what data to collect from the well and how to operate the data acquisition process to maximize the asset net present value and reduce uncertainty in net present value;

Where to drill appraisal wells and what data to collect and when from those wells and how to operate the data acquisition process to maximize the asset net present value and reduce uncertainty in net present value;

Where to drill development wells and what data to collect and when from those wells and how to operate the data acquisition process to maximize the asset net present value and reduce uncertainty in net present value; and, Where to drill pilot wells to test recovery processes and what data to collect and when from those wells and how to operate the data acquisition process to maximize the asset net present value and reduce uncertainty in net present value.

This summary is provided to introduce a selection of concepts that are further described below in the detailed description. This summary is not intended to identify key or essential features of the claimed subject matter, nor is it intended to be used to limit the scope of the claimed subject matter.

As used herein, "realization" means a possible model that could represent the reality of the unknown properties. A user could generate a large number of different realizations and pick a list of typical realizations for specific studies.

As used herein, "uncertainty band" means the difference between P10 and P90 variables in a specific ensemble.

The use of the word "a" or "an" when used in conjunction with the term "comprising" in the claims or the specification means one or more than one, unless the context dictates otherwise.

The term "about" means the stated value plus or minus the margin of error of measurement or plus or minus 10% if no method of measurement is indicated.

The use of the term "or" in the claims is used to mean "and/or" unless explicitly indicated to refer to alternatives only or if the alternatives are mutually exclusive.

The terms "comprise", "have", "include" and "contain" (and their variants) are open-ended linking verbs and allow the addition of other elements when used in a claim.

The phrase "consisting of" is closed, and excludes all additional elements.

The phrase "consisting essentially of" excludes additional material elements, but allows the inclusions of non-material elements that do not substantially change the nature of the disclosure.

The following abbreviations are used herein:

| ABBREVIATION | TERM |
| --- | --- |
| EnKF | Ensemble Kalman filter |
| VOI | Value of information |
| NPV | Net present value |

| ABBREVIATION | TERM |
| --- | --- |
| Pdf | probability density function |
| D&RA | Decision and risk assessment |
| NPV | Net present value |

DESCRIPTION OF EMBODIMENTS OF THE DISCLOSURE

Figure 1:
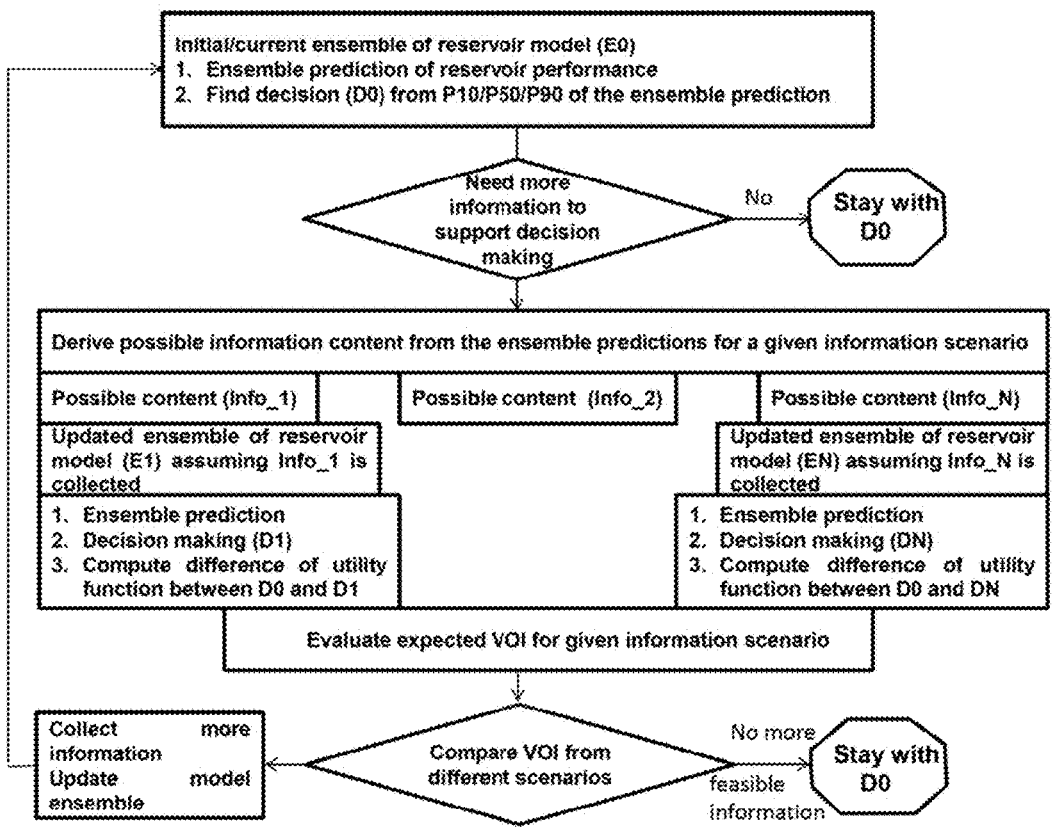
FIG. 1. Ensemble based decision-making workflow (rigorous).

The disclosure provides a novel method for performing an ensemble-based analysis of one or more hydrocarbon reservoir exploitation strategies taking into consideration one or more uncertain parameters. The method also includes consideration of the value of additional information (such as that collected from additional sensors or new measurements) and best placement of e.g. sensors, appraisal wells, and the like. Accordingly, the method may further comprise determining a new set of equally probable reservoir model scenarios based on potential reduction in uncertainty attributable to the collection of additional information. An ensemble Kalman Filter (EnKF) is then used to accelerate valuation of information having a large number of uncertain parameters.

There are five basic steps in a decision and risk assessment (D&RA):
1. Frame the decision problem
2. Model the frame
3. Quantify risks and uncertainties
4. Analyze the model
5. Make decisions A large focus of D&RA is understanding the uncertainties inherent in the decision problem by applying probabilities to a range of possibilities for each potentially significant uncertainty. With the help of mathematical and graphical tools, a user can bring simplicity to complicated scenarios to allow for valuable information to come to light. D&RA can identify uncertainties that are most important to a projects success, which will allow users to optimize information-gathering activities and to determine when more information will not change the outcome. Having more valuable information earlier on facilitates better project definition and avoids costly design changes down the road.

D&RA is difficult in the oil and gas industry because of the enormous amount of data needed and the many type and forms of data. For instance, in a single project, there can be multiple data types for i.e. geological descriptions or engineering parameters that need to be combined in the assessment.

The present method is an accelerated workflow that focuses on step 2 and 3 by developing a model that incorporates many different data types into a single model. Determining the risks and uncertainties of such a complicated model can be very computationally intensive. As such, some embodiments of the present method include methods to accelerate this determination to quickly obtain the value of information.

In more detail, an ensemble of reservoir model is built using a number of realizations (typically 100) from existing reservoir data or an updated ensemble of reservoir model is used in a decision making process. The chosen ensemble of reservoir model (E0) defines an input uncertainty band and has a utility function. The decision-making is based on maximizing this utility function and reducing the uncertainty band.

An ensemble prediction of some system performance output variable is calculated from the ensemble model (E0) and a decision (D0) from one or more target percentiles, i.e. P10/P50/P90. Mathematically speaking, the P10, P50, and P90 represent the $10^{th}$, $50^{th}$, and $90^{th}$ percentiles of the ranges of the uncertain reservoir performance variable, respectively. While these are the most commonly used percentiles in modeling, any targeted percentile can be used.

Upon the user's judgment, the workflow could choose either one or a combination of uncertainty bounds, net present value (NPV) cuts and other economic metrics as guides for requiring more information. Depending on these settings, the workflow will determine if more information is needed or if the user should stay with D0.

In most situations, the system performance output variable is a financial variable such as rate of return or net present value. In other instances, the system performance variable can be the amount of uncertainty remained after assimilation all the present data. Both choices could impact the quality of decisions. Other outputs are also possible and depend on the needs of the user.

If more information is needed to support the decision or reduce the risks and uncertainty of the decision, then the ensemble reservoir model is updated to include possible outputs for at least one information scenario to create a temporary ensemble model (En) which has a smaller uncertainty band than the original ensemble model. The information scenarios can include outputs for e.g. multiple information acquisition approaches and/or settings, different location and time that data is collected and can be any type of data. For each temporary ensemble reservoir model, a decision (Dn) is determined from the predictions of the temporary model.

The information scenarios may have the same data as the realizations in the original ensemble model. More likely, however, the information scenarios will not match the data in any of the realizations, but could be used to update the ensemble models so that they are conditioned to the information.

The value of the information for each temporary ensemble model is calculated by determining the difference of the utility function for D0 and Dn. This value of new information can be compared for multiple information scenarios and multiple Dn to determine the best action step to take. Typically, the information scenario that matches one or more target percentiles of the original ensemble model E0 will be selected. Typically, actual information according to the information scenario will be gathered and incorporated into the original ensemble reservoir model. The updated model can be re-analyzed according to the above method.

In some embodiments of the present method, comparison of the different information scenarios and their value of information can be accelerated using an ensemble Kalman Filter (EnKF). This will ease the computational strain and time. While helpful in most cases, the accelerated EnKF is not mandatory. As before, when the best new information is determined, the ensemble of reservoir model is updated with this information. Additional types of information can be evaluated and added to the model to supplement D0.

Kalman filtering is an algorithm that uses a series of measurements observed over time and containing noise and/or other inaccuracies, to produce estimates of unknown variables that tend to be more precise than those based on a single measurement alone. In other words, this filter operates recursively on the streams of noisy input data to produce a statistically optimal estimate of the underlying system state.

The ensemble Kalman Filter (EnKF) is a Monte Carlo approximation of the Kalman filter and was developed for use with large problems. Given a probability density function (pdf) of the state of a modeled system (the prior, called often the forecast in geosciences) and the data likelihood, the Bayes theorem is used to obtain the pdf after the data likelihood has been taken into account (the posterior, often called the analysis). This is called a Bayesian update. EnKFs represent the distribution of the system state using a collection of state vectors, called an ensemble, and replace the covariance matrix by the sample covariance computed from the ensemble. The ensemble is operated as if it were a random sample, but the ensemble members are really not independent—the EnKF ties them together.

The unique features of the ensemble Kalman filter are summarized below:

(1) EnKF incrementally updates reservoir models assimilating production data sequentially with time as they become available, thus it is ideally suited for real-time applications;

(2) An ensemble of reservoir models that reflect the most current production data are always maintained. Thus, the performance predictions and uncertainty are always available for optimization study;

(3) EnKF is computationally fast because of the efficiency of parallel/distributing computing;

(4) EnKF can be applied with any reservoir simulator without the need of complicated coding; and (5) EnKF does not need optimization and sensitivity coefficients calculations.

The inventors found that an ensemble based decision-making workflow can be used to compare value of information (VOI) from different scenarios, particularly those with a large number of uncertainty parameters. More information helps to make better decisions. This is especially important in reservoir risk management where large amounts of money are allocated towards developing reservoirs. The decision-making process can be accelerated when multiple scenarios have to be compared using EnKF.

The present method relates to decision theory, which is concerned with identifying the values, uncertainties, and other issues relevant in a given decision, its rationality and the resulting optimal decision. In the present method, a decision is made based on an average utility function over the uncertainty space. Specifically, the utility function for a given model and decision is U(m,d), wherein m is a realization of the uncertain reservoir model and d is a decision made out of a few choices.

The decision rule and utility function is defined using an ensemble of reservoir model made from existing information. This may include optimization steps to find best outcome. The ensemble-based method quickly updates the workflow model, i.e. using EnKF. This speeds up the decision making process. Once a decision is made, it can then be applied to the reservoir in order to further development and/or production of that reservoir.

In more detail, to obtain a maximal value of information, it is often necessary to compare different information scenarios. The EnKF can be used as a fast way to evaluate the value of information between the different information scenarios, thus accelerating the updating of the model and speeding up the decision making process. The VOI is expected to increase in utility function when evaluated before obtaining information, thus VOI is always non-negative. When information added to the model that does not lead to changes in a decision, the VOI is zero. This information can then be used to determine the best decision.

The ensemble based decision making workflow for a reservoir model is shown in FIG. 1 and consists of three iterative steps:

1. Evaluate the decision to be made based on the initial/current ensemble of reservoir model (E0) derived from existing information. From the span (P10/P50/P90) of reservoir performance ensemble predictions (NPV_0), one may decide whether or not more information is needed to reduce the uncertainty for better decision-making. The decision-making is based on maximizing a utility function. In FIG. 1, the utility function, U(D, NPV), is used to quantify the level of satisfaction for decision D for a given prediction ensemble NPV. One could define this function in many ways, and in the horizontal wells development appraisal example described below, it is derived from the average of NPV. Here, NPV represents 'net present value'.

2. Evaluate expected values of information to be collected if multiple information acquisition approaches and settings are chosen. In FIG. 1, these approaches and settings are denoted information scenarios. The different information scenarios can have different types of data (i.e., water production rates, pressure data, core data etc.) or different location and time that data needs to be collected.

FIG. 1 shows only the workflow for a given scenario. The workflow has to be repeated for different information scenarios if multiple choices of information scenarios exist. Possible information contents from 1 to N are possible outputs from a specific information scenario, and each one of them corresponds to a temporary ensemble of model (E1 to EN) obtained by applying both the existing information and assumed information output, so these ensembles have reduced uncertainty bands compared to E0. The expected value of information is just an average of the utility function changes induced by the decision changes. Rigorously executing this step is very computationally expensive and very time consuming.

3. After step 2 is repeated for different information acquisition scenarios, the expected value of information is obtained for each one of them. This expected value is used to decide which information scenario is going to be used. If the expected VOI for all scenarios are too small compared to the cost of data acquisition, one may decide to stay with the existing decision without further data acquisition.

As more data is gathered and implemented in E0, steps 1-3 can be repeated to more accurately determine the VOI.

Most of time, one will need to compare different information scenarios using step 2 workflow to get maximal value of information, which could e.g., be different appraisal well locations. Thus, a fast way to evaluate the VOI is beneficial. The ensemble Kalman Filter provides the acceleration needed to compare multiple information scenarios. EnKF is used to update system uncertainty parameters and determine if any related measurements are made.

The accelerated EnKF based workflow disclosed herein can be used by itself or combined with the rigorous workflow, depending on the problem to be solved. However, the EnKF based workflow is often used alone as it takes less time to re-evaluate each updated model than the rigorous and EnKF based model workflow combined.

The disclosure method include one or more of the following embodiments, in any combination:

A ensemble-based method for decision making process having the steps of framing a decision problem; uploading existing frame data into a modeling program; generating and combining at least 2 realizations of the existing frame data to create an ensemble model ($E_0$), which defines an input uncertainty band; deriving at least one system performance output variable and one or more target percentiles of for the system performance output variable from an ensemble prediction of the ensemble model; determining a first decision ($D_0$) using the target percentiles and a utility function for the ensemble model; updating the ensemble model with possible outputs of at least one pre-determined information scenario to create at least one temporary ensemble model ($E_n$), which has a smaller uncertainty band than $E_0$; deriving at least one system performance output variable from an ensemble prediction of each temporary ensemble model; determining at least one second decision from the temporary ensemble models; calculating a value of information (VOI) for each information scenario wherein the VOI is the difference of the utility function between the second decision of that information scenario and the first decision; comparing the VOI for each information scenario; and, selecting the information scenario that matches the target percentiles of the ensemble model or, no selection if no information scenario matches the target percentiles.

A ensemble-based method for decision making process having the steps of uploading existing reservoir data into a modeling program; generating and combining at least 2 realizations of the existing reservoir data to create an ensemble of reservoir model ($E_0$), which defines an input uncertainty band; deriving at least one system performance output variable and one or more target percentiles of the system performance output variable from an ensemble prediction of the ensemble of reservoir model; determining a first decision ($D_0$) from the target percentile(s) and a utility function for the ensemble of reservoir model; updating the ensemble of reservoir model with possible outputs of at least one pre-determined information scenario to create at least one temporary ensemble of reservoir model ($E_n$), which has a smaller uncertainty band than $E_0$; deriving at least one system performance output variable from an ensemble prediction of each temporary ensemble of reservoir model; determining at least one second decision for each of the temporary ensemble of reservoir model; calculating a VOI for each information scenario wherein the VOI is the difference of the utility function between the second decision of that information scenario and the first decision; comparing said VOI for each information scenario; selecting the information scenario that matches the target percentiles of said ensemble of reservoir model, or if no information scenario matches the target percentiles, no selection is made.

A ensemble-based method for decision making process having the steps of uploading existing reservoir data into a modeling program; generating and combining at least 2 realizations of the existing reservoir data to create an ensemble of reservoir model ($E_0$), which defines an input uncertainty band; deriving at least one system performance output variable and one or more target percentiles of the system performance output variable from an ensemble prediction of the ensemble of reservoir model; determining a first decision ($D_0$) from the target percentiles and utility function for ensemble of reservoir model; applying an ensemble Kalman filter to the ensemble of reservoir model to update the model with possible outputs of at least one pre-determined information scenario to create at least one temporary ensemble of model ($E_n$), wherein the temporary ensemble of model has a smaller uncertainty band than $E_0$; deriving at least one system performance output variable from an ensemble prediction of each temporary ensemble of reservoir model; determining at least one second decision for each of the temporary ensemble of model; calculating a VOI for each information scenario wherein the VOI is the difference of the utility function between the second decision of that information scenario and the first decision; comparing the VOI for each information scenario; selecting the information scenario that matches the target percentiles of the ensemble of reservoir model or making no selection if there isn't a match.

In any of the methods described herein, the process can be iterated as often as needed, and once an optimal decision is found, it can then be applied to the reservoir.

In any of the methods herein described, the ensemble Kalman filter can be used to update the ensemble of reservoir model.

Any reservoir data can be used to build the model. Typically, the data consists of geological descriptions and/or engineering parameters. Exemplary types of data include core, well, and production logging data, production data, tracers, seismic data, and/or subsurface reservoir surveillance and illumination data. Additionally, porosity and permeability data is utilized.

In any of the above methods, the system performance output variable can be a financial variable such as is net present value, rate of return, asset value, and uncertainty band of these values.

The present disclosure is further exemplified with respect to the following examples and figures. However, this is exemplary only, and the disclosure can be broadly applied to any area using decision theory and a large number of uncertain parameters. The following descriptions are intended to be illustrative only, and not unduly limit the scope of the appended claims.

Synthetic Horizon Well

An ensemble of reservoir models was applied to a synthetic well development appraisal project. The decision to be made was whether it is feasible to place a horizontal producer and a horizontal injector at the given locations shown in FIG. 2. The decision is made based on the drilling and managing of the two horizontal wells for 5 years costing $50M.

Once the model was prepared, different information scenarios such as whether to drill 1 or 3 vertical wells were then analyzed using the EnKF method. Different drilling locations provide different information for EnKF workflow to update the model. The utility function in this example is reduction of the uncertainty band.

Rigorous Approach:

The ensemble based decision-making workflow shown in FIG. 1 is considered a rigorous approach when compared to the EnKF approach. Initially, a 50×50×1 grid reservoir was assumed with "real" porosity and permeability descriptions defined in a geomodel (sequential Gaussian simulation) workflow. As many realizations of reservoir models as we need were derived from this model. The software we used here for sequential Gaussian simulation is GSLIB developed at Stanford University.

In step 1, 100 realizations of porosity and permeability fields were randomly generated as combined and set as the initial ensemble of reservoir model (E0). Then, flow simulations were performed for each one of the realizations. A NPV for the given period of production was determined to range from $41M to $67M with an average of $52M.

The following utility function was used for decision making:

$$\begin{cases} \text{if } NPV_{avg}(E) >= 50M & \text{do not approve: } D = 1 \quad U(D, NPV) = NPV_{avg}(E) - 50M \\ \text{if } NPV_{avg}(E) < 50M & \text{approve: } D = 0 \quad U(D, NPV) = 0 \end{cases}$$

where $NPV_{avg}(E)$ is the average of NPV from the ensemble E if the development plan is approved. The larger the value of the utility function is, the more satisfied we are. Thus, the decision D is just maximizing the utility function. This is the same for the accelerated EnKF workflow.

In this example, the uncertainty bounds will determine if the decision will be to approve the project because no further information is obtained or if more information is needed before the project can be approved.

For the synthetic data, NPV was above 50M, thus the decision will not be approved and more information is needed because the uncertainty bound tells us there are still significant chance that this project could fail. To obtain more information, we propose drilling three vertical wells to collect some core data with the hopes that the data collected will be able to confirm or change the decision and hence has some value. This will be evaluated and compared with the cost of drilling the vertical wells to decide whether this piece of information is beneficial.

Therefore, in step 2, we focused on only one information scenario of obtaining the core data from three vertical appraisal wells (porosity and permeability information) at given locations as additional input to the geomodel, which will induce smaller model uncertainty. In this workflow, we will assume the output from the three wells could be in the space spanned by the 100 initial realizations, i.e. we use those realizations to span the uncertainty space of the porosity and permeability information at the appraisal wells before we actually drill them.

Thus, we get 100 possible informational contents for this information scenario, and input each one of them into the geo-model package (here is sequential Gaussian simulation) to get 100 ensembles of realizations with each one of them containing 100 individual realizations. Thus, rigorous estimation of value of information consists of 10,000 geo-model and flow simulations for just one information scenarios (fixed appraisal well locations)! If we want to find out sensitivity on the vertical well locations, we may need to run more than a million simulations. In the workflow graph, the selection of information scenario could be set as sensitivity variation.

Figure 2:
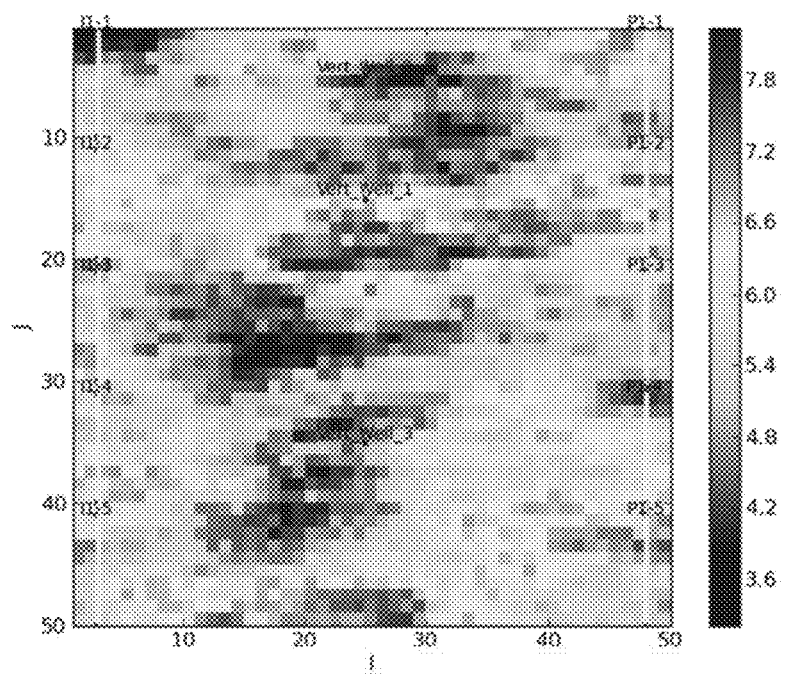
FIG. 2. A realization from the model ensemble (LnK).
Figure 3:
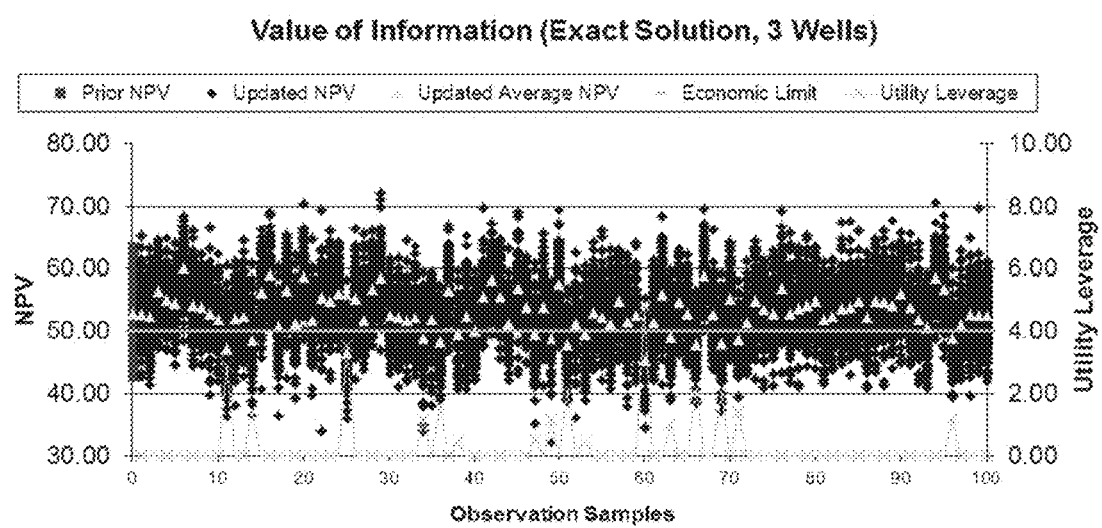
FIG. 3. Value of information computation plot for a given information scenario (rigorous).

The results of computing the rigorous value of information for the given vertical well locations shown in FIG. 2 are shown in FIG. 3. In this figure, the central straight line is the economic limit of $50M; the gray dots on the left at the origin point of X-axis are the NPV from the 100 initial realizations, and the bright dots on the top of them is the average of the 100 NPV values; the dark points are the NPV from the 10,000 realizations described above with each row from a specific possible information content, and the bright dots on the top of each one are the averages NPV of each ensemble.

As shown in FIG. 1, the tentative decisions D1 to DN (N=100) are obtained from the 100 ensembles, and the utility function differences in FIG. 1 are used to measure the possible benefits out of each possible output, which is zero if the decision does not change and positive if the decision is changed. The bottom zig-zag curve in FIG. 3 shows the utility function change for each of the possible information content. The average of the utility function is the expected value of information from this information scenario (in FIG. 1).

In step 3, compare the expected value of information with the cost of drilling the three appraisal wells. If it is beneficial, the real collected data will be used to update the reservoir model with reduced uncertainty, and then go through another iteration of the three steps until one hits the exit points in step 1 or 3.

Most of time, one will need to compare different information scenarios using step 2 workflow to get maximal value of information, as described above, which could be different appraisal well locations. So, a faster way to evaluate the value of information would be beneficial.

EnKF Approach:

EnKF is used to update system uncertainty parameters and compare more than one information scenarios. In this example, it was used to derive the uncertainty of NPV.

Figure 4:
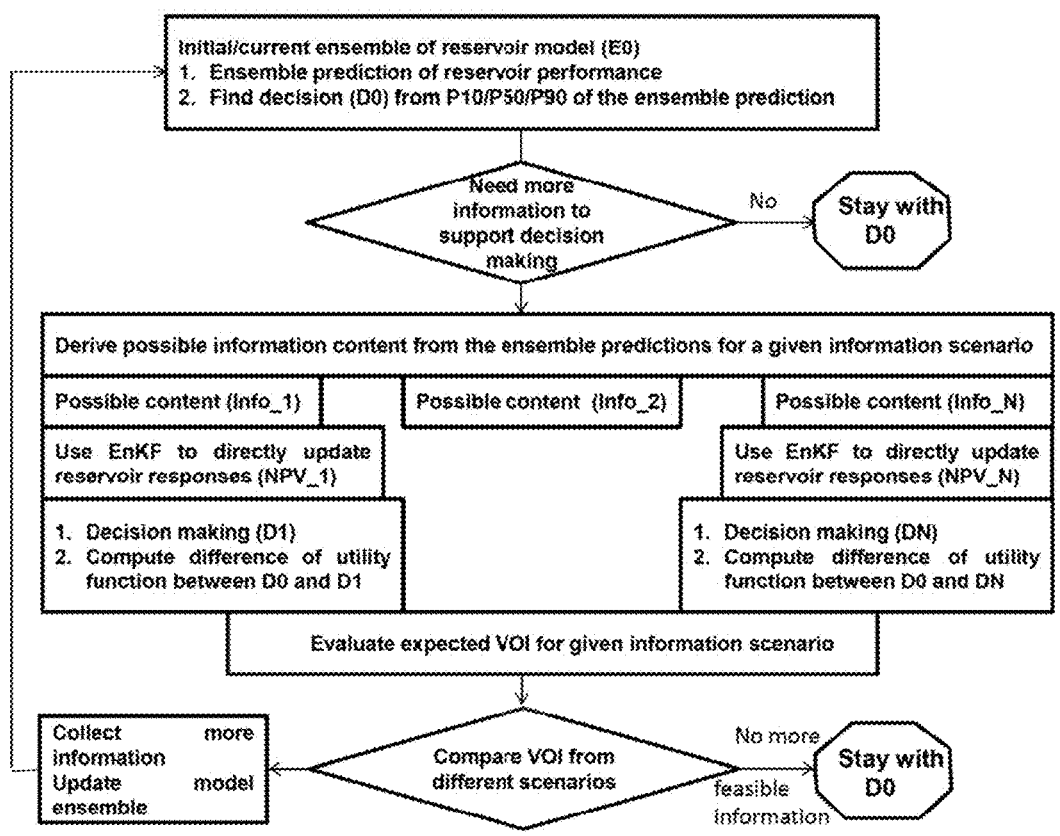
FIG. 4. Ensemble based decision-making workflow (EnKF).

Using the workflow shown in FIG. 4, EnKF uses NPV from initial ensemble E0 (NPV_0) as input, and uses the content of the possible information as observations (obs_i), and the output is the updated NPV for this ensemble: NPV_i. In this way the computational cost in the step 2 is reduced to a few seconds since the whole geo-modeling and simulations during the model updating step is bypassed (compare FIGS. 1 and 4) unless one chooses to go through the rigorous option for a few realizations to validate the results.

Figure 5:
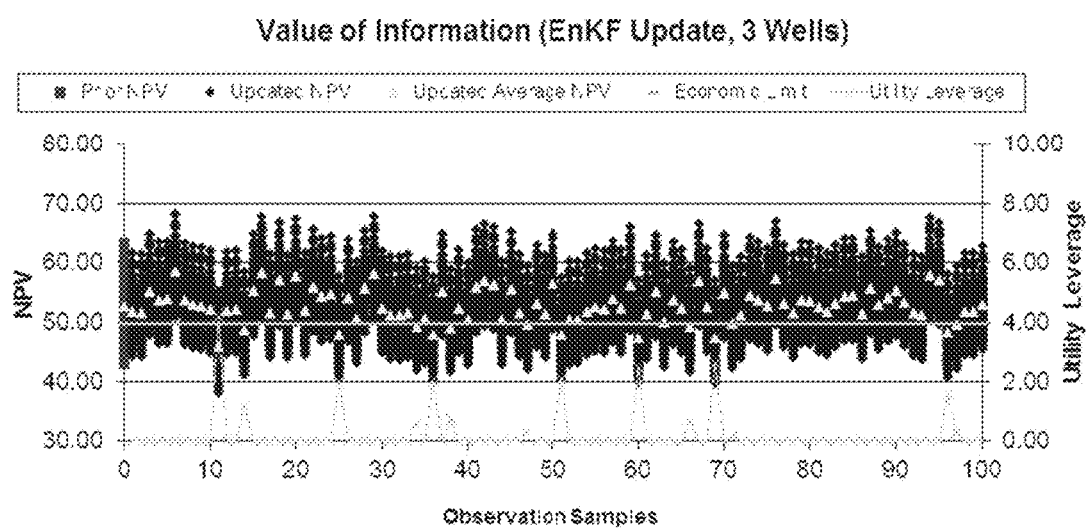
FIG. 5. Value of information computation plot for a given information scenario (EnKF).

FIG. 5 is the VOI computation plot from the EnKF approach, and the results are comparable to FIG. 3, wherein the central straight line is the economic limit of $50M; the gray dots on the left at the origin point of X-axis are the NPV from the 100 initial realizations, and the bright dots on the top of them is the average of the 100 NPV values; the dark points are the NPV from the 10,000 realizations described above with each row from a specific possible information content, and the bright dots on the top of each one are the averages NPV of each ensemble.

Figure 6:
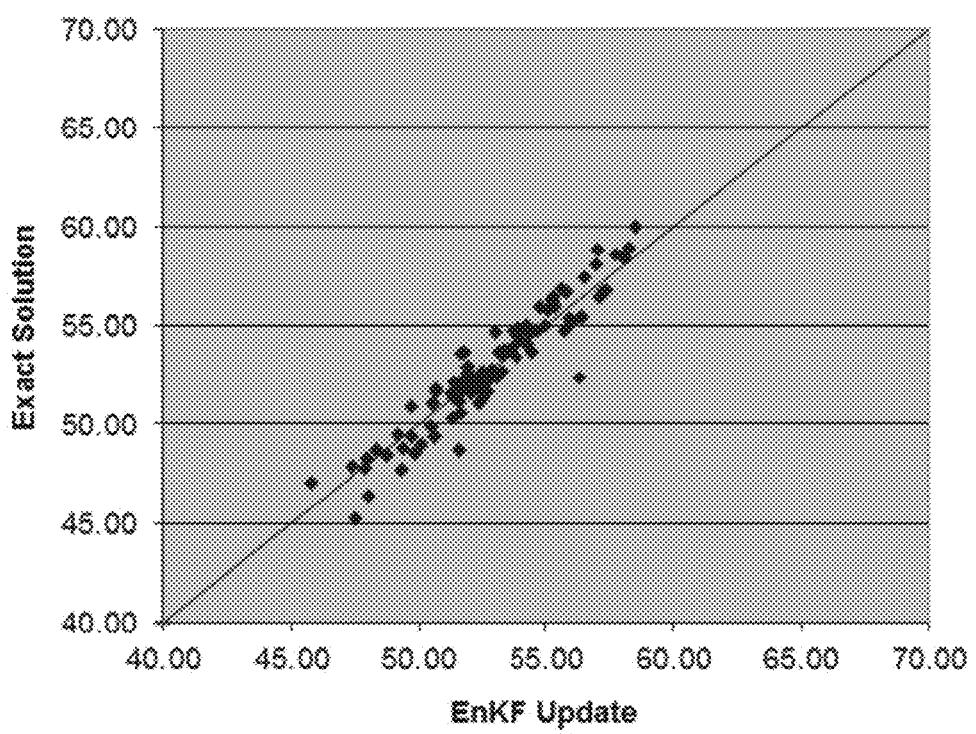
FIG. 6. Comparison of average updated NPV from two methods.

To make the comparison between FIG. 3 and FIG. 5 more obvious, FIG. 6 shows the cross plot of the ensemble average (bright points in FIGS. 3 and 5) obtained from the two approaches. Here, the EnKF gives a decent estimate of NPV, and hence a good estimate of VOI.

Figure 7:
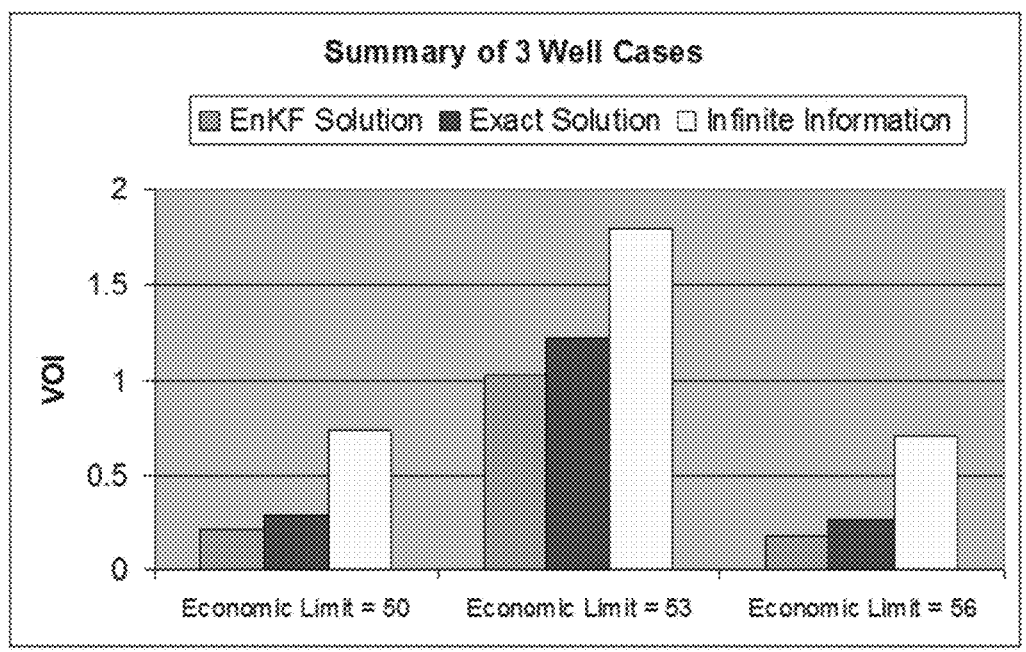
FIG. 7. Value of information comparison for different economic limits.

FIG. 7 shows a sensitivity run with different economic limits. The infinite information case means porosity and permeability information was available for all the gridblocks. Both EnKF and rigorous solution of NPV are quite close, and both give same conclusion: if economic limit is very close to the average NPV, the value of information is maximal.

Figure 8:
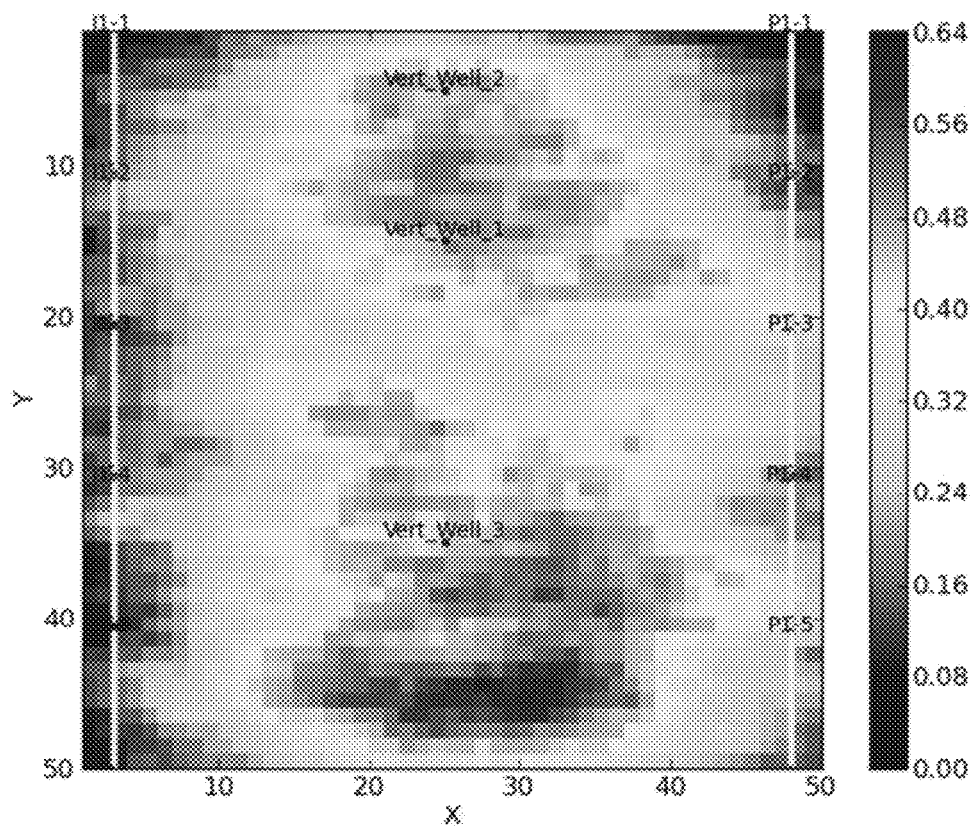
FIG. 8. VOI if we place appraisal wells at different locations.

Since the EnKF workflow is extremely fast, one can generate value of information maps assuming different choices of well locations. FIG. 8 is the results of VOI values obtained by repeating the workflow in FIG. 4 gridblock by gridblock. The highest VOI is seen where the appraisal wells are placed in the middle between the two horizontal wells.

The following references are incorporated by reference in their entirety.

U.S. Pat. No. 7,512,543 Tools for decision-making in reservoir risk management

U.S. Pat. No. 7,584,081 Method, system and apparatus for real-time reservoir model updating using ensemble Kalman filter US20130338983 System and method for use in simulating a subterranean reservoir US20120215511 System and method for modeling a subterranean reservoir US20120191433 Method for real-time reservoir model updating from dynamic data while keeping the coherence thereof with static observations US20070118346 Method, system and apparatus for real-time reservoir model updating using ensemble Kalman filter US20100185428 Method and system for simulating fluid flow in an underground formation with uncertain properties SPE 75235 (2002) Naevdal, G., et al., "Near-well reservoir monitoring through ensemble Kalman filter: Reservoir monitoring and continuous model updating using ensemble Kalman filter"

SPE 84372 (2003) Naevdal, G., et al., "Reservoir monitoring and continuous model updating using ensemble Kalman filter," available online at http://enkfnersc.no/Publications/nae03a.pdf.

SPE-117274-PA (2009) Aanonsen S. I., et al., The Ensemble Kalman Filter in Reservoir Engineering—a Review SPE 96375 (2005) Analysis of the ensemble Kalman filter for estimation of permeability and porosity in reservoir models, available online at http://enkfnersc.no/Publications/lor05a.pdf SPE 92991 (2003) Wen X. H. et al., Real-Time Reservoir Model Updating Using Ensemble Kalman Filter, available online at http://enkfnersc.no/Publications/wen05a.pdf

The invention claimed is:

1. A ensemble-based method for decision making process, the method comprising:
acquiring frame data from one or more sensors;
generating and combining at least two realizations from the frame data to create an ensemble model (E0), wherein the ensemble model defines an input uncertainty band;
deriving at least one system performance output variable and one or more target percentiles of the system performance output variable from an ensemble prediction of the ensemble model;
determining a first decision (D0) from the derived one or more target percentiles and a utility function for the ensemble model;

updating the ensemble model with possible outputs of at least one pre-determined information scenario to create at least one temporary ensemble model (En), wherein the temporary ensemble model has a smaller uncertainty band than E0;

deriving at least one system performance output variable from an ensemble prediction of each temporary ensemble model;

determining at least one second decision for each temporary ensemble model;

calculating a value of information (VOI) for each pre-determined information scenario wherein the VOI is the difference of the utility function between the second decision of the pre-determined information scenario and the first decision;

comparing the VOI for each pre-determined information scenario; and, selecting one of the pre-determined information scenarios that matches the one or more target percentiles of the ensemble model, wherein if no predetermined information scenario matches the one or more target percentiles, then no selection is made.

2. The method of claim 1, wherein updating the ensemble model uses an ensemble Kalman filter (EnKF).

3. The method of claim 1, wherein the system performance output variable is a financial variable.

4. The method of claim 1, wherein the financial variable is net present value, rate of return, asset value, and uncertainty band of these values.

5. A ensemble-based method for decision making process, the method comprising:

acquiring reservoir data from one or more sensors communicatively coupled to a reservoir;

generating and combining at least two realizations of the reservoir data to create an ensemble of reservoir model (E0), wherein the ensemble of reservoir model defines an input uncertainty band;

deriving at least one system performance output variable and one or more target percentiles of the system performance output variable from an ensemble prediction of the ensemble of reservoir model;

determining a first decision (D0) from the derived one or more target percentiles and a utility function for the ensemble of reservoir model;

updating the ensemble of reservoir model with possible outputs of at least one pre-determined information scenario to create at least one temporary ensemble of reservoir model (En), wherein the temporary ensemble of reservoir model has a smaller uncertainty band than E0;

deriving at least one system performance output variable from an ensemble prediction of each temporary ensemble of reservoir model;

determining at least one second decision for each of the temporary ensemble of reservoir model;

calculating a VOI for each pre-determined information scenario wherein the VOI is the difference of the utility function between the second decision of that information scenario and the first decision;

comparing the VOI for each pre-determined information scenario;

selecting at least one pre-determined information scenario that matches the one or more target percentiles of the ensemble of reservoir model, wherein if no information scenario matches the one or more target percentiles, then no selection is made.

6. The method of claim 5, further comprising repeating the ensemble of reservoir model and the temporary ensemble of reservoir model to compare a VOI for an updated ensemble of reservoir model (E0).

7. The method of claim 5, wherein updating the ensemble model uses an ensemble Kalman filter (EnKF).

8. The method of claim 5, wherein the reservoir data includes geological descriptions and/or engineering parameters.

9. The method of claim 5, wherein the reservoir data includes core, well, and/or production logging data, production data, tracers, seismic data, and/or subsurface reservoir surveillance and illumination data.

10. The method of claim 5, wherein the reservoir data consists of porosity and/or permeability data.

11. The method of claim 5, wherein the system performance output variable is a financial variable.

12. The method of claim 11, wherein the financial variable is net present value, rate of return, asset value, and uncertainty band of these values.

13. A ensemble-based method for decision-making process, the method comprising:

acquiring reservoir data from one or more sensors communicatively coupled with a reservoir;

generating and combining at least two realizations of the reservoir data to create an ensemble of reservoir model (E0), wherein the ensemble of reservoir model defines an input uncertainty band;

deriving at least one system performance output variable and one or more target percentiles of the system performance output variable from an ensemble prediction of the ensemble of reservoir model;

determining a first decision (D0) from the derived one or more target percentiles and a utility function for the ensemble of reservoir model;

applying an ensemble Kalman filter to the ensemble of reservoir model to update the ensemble of reservoir model with possible outputs of at least one pre-determined information scenario to create at least one temporary ensemble of model (En), wherein the temporary ensemble of model has a smaller uncertainty band than E0;

deriving at least one system performance output variable from an ensemble prediction of each temporary ensemble of reservoir model;

determining at least one second decision for each of the temporary ensemble of model;

calculating a VOI for each pre-determined information scenario wherein the VOI is the difference of the utility function between the second decision of that pre-determined information scenario and the first decision;

comparing the VOI for each pre-determined information scenario;

selecting at least one pre-determined information scenario that matches the one or more target percentiles of the ensemble of reservoir model, wherein if no pre-determined information scenario matches the one or more target percentiles, then no selection is made; and applying the selected information scenario to the reservoir.

14. The method of claim 13, wherein the reservoir data consist of geological descriptions and/or engineering parameters.

15. The method of claim 13, wherein the reservoir data includes core, well, and/or production logging data, production data, tracers, seismic data, and/or subsurface reservoir surveillance and illumination data.

16. The method of claim 13, wherein the reservoir data includes porosity and/or permeability data.

17. The method of claim 13, wherein the system performance output variable is a financial variable.

18. The method of claim 17, wherein the financial variable is net present value, rate of return, asset value, and uncertainty band of these values.

19. The method of claim 1, further comprising determining a location to drill one or more wellbores and drilling one or more wellbores based on the at least one pre-predetermined information scenario.

20. The method of claim 1, wherein one or more sensors collect reservoir data including porosity, permeability, geological descriptions, engineering parameters, core, well, and/or production logging data, production data, tracers, seismic data, and/or subsurface reservoir surveillance and illumination data.

* * * * *